(12) United States Patent
Liang

(10) Patent No.: US 7,558,074 B2
(45) Date of Patent: Jul. 7, 2009

(54) PARTITIONING DEVICE FOR HOLDING SLOTS OF A HOST COMPUTER CASE

(75) Inventor: Chien-Fa Liang, Chung-Ho (TW)

(73) Assignee: Super Micro Computer, Inc., San Jose, CA (US)

( * ) Notice: Subject to any disclaimer, the term of this patent is extended or adjusted under 35 U.S.C. 154(b) by 459 days.

(21) Appl. No.: 11/353,133

(22) Filed: Feb. 14, 2006

(65) Prior Publication Data

US 2007/0188996 A1 Aug. 16, 2007

(51) Int. Cl.
*H05K 7/14* (2006.01)
*H05K 7/20* (2006.01)

(52) U.S. Cl. .................. 361/796; 361/692; 361/687; 361/730; 361/728; 174/50; 174/520; 211/41.17

(58) Field of Classification Search .............. 361/686, 361/788, 796, 688, 692, 683, 730, 728, 687, 361/752; 174/50, 520; 211/41.17
See application file for complete search history.

(56) References Cited

U.S. PATENT DOCUMENTS

| | | | |
|---|---|---|---|
| 5,912,799 A * | 6/1999 | Grouell et al. .............. 361/685 |
| 6,198,633 B1 * | 3/2001 | Lehman et al. ............. 361/756 |
| 6,456,498 B1 * | 9/2002 | Larson et al. ............... 361/752 |
| 6,552,915 B2 * | 4/2003 | Takahashi et al. ........... 361/796 |
| 6,836,030 B2 * | 12/2004 | Smith et al. ................. 307/147 |
| 6,999,319 B2 * | 2/2006 | Wu et al. ..................... 361/724 |
| 7,007,809 B2 * | 3/2006 | Greenside ................ 211/41.17 |
| 7,369,416 B2 * | 5/2008 | Plabst ........................ 361/818 |
| 7,374,259 B2 * | 5/2008 | Wu et al. ................. 312/223.2 |

* cited by examiner

*Primary Examiner*—Dameon E Levi
(74) *Attorney, Agent, or Firm*—Lowe Hauptman Ham & Berner LLP

(57) ABSTRACT

A partitioning device for holding slots of a host computer case, including:

a host computer outer case provided with a horizontal upper panel; an upper cover;

more than one rectangular partition; vertical connecting holes are defined in an upper side of each of the rectangular partitions, which provide for vertical penetration into the holding slot; bolts bolt into the through holes and into the vertically connecting holes, thereby fixing the partitions within the holding slot, thus partitioning the holding slot and forming at least more than two holding spaces, thereby achieving control of the number and size of the more than two holding spaces so as to accommodate he insertion of modular cases of various size specifications.

1 Claim, 5 Drawing Sheets

PARTITIONING DEVICE FOR HOLDING SLOTS OF A HOST COMPUTER CASE

BACKGROUND OF THE INVENTION (a) Field of the Invention

The present invention relates to a partitioning device for holding slots of a host computer case, and more particularly to a configuration that enables assembling or disassembling of at least more than one partition in holding slots to control the number of holding spaces in the holding slots, thereby achieving provision for the insertion of at least more than one modular case.

(b) Description of the Prior Art

Size and number of holding slots provided by a conventional industrial host computer case for the insertion of modular cases is invariable. Hence, if an additional set of modular cases is to be inserted or if it is required to replace the original modular cases with a new set of modular cases of different size specifications, then the holding slots of the conventional host computer case cannot be adapted to accommodate the modular cases.

SUMMARY OF THE INVENTION

The primary objective of the present invention is to provide a partitioning device for holding slots of a host computer case that enables choosing at least more than one partition to be able to be fixed at different positions within a holding slot, thereby controlling size and number of more than two holding spaces in order to accommodate modular cases of different dimensions.

To enable a further understanding of said objectives and the technological methods of the invention herein, brief description of the drawings is provided below followed by detailed description of the preferred embodiments.

DETAILED DESCRIPTION OF THE PREFERRED EMBODIMENTS

Figure 1:
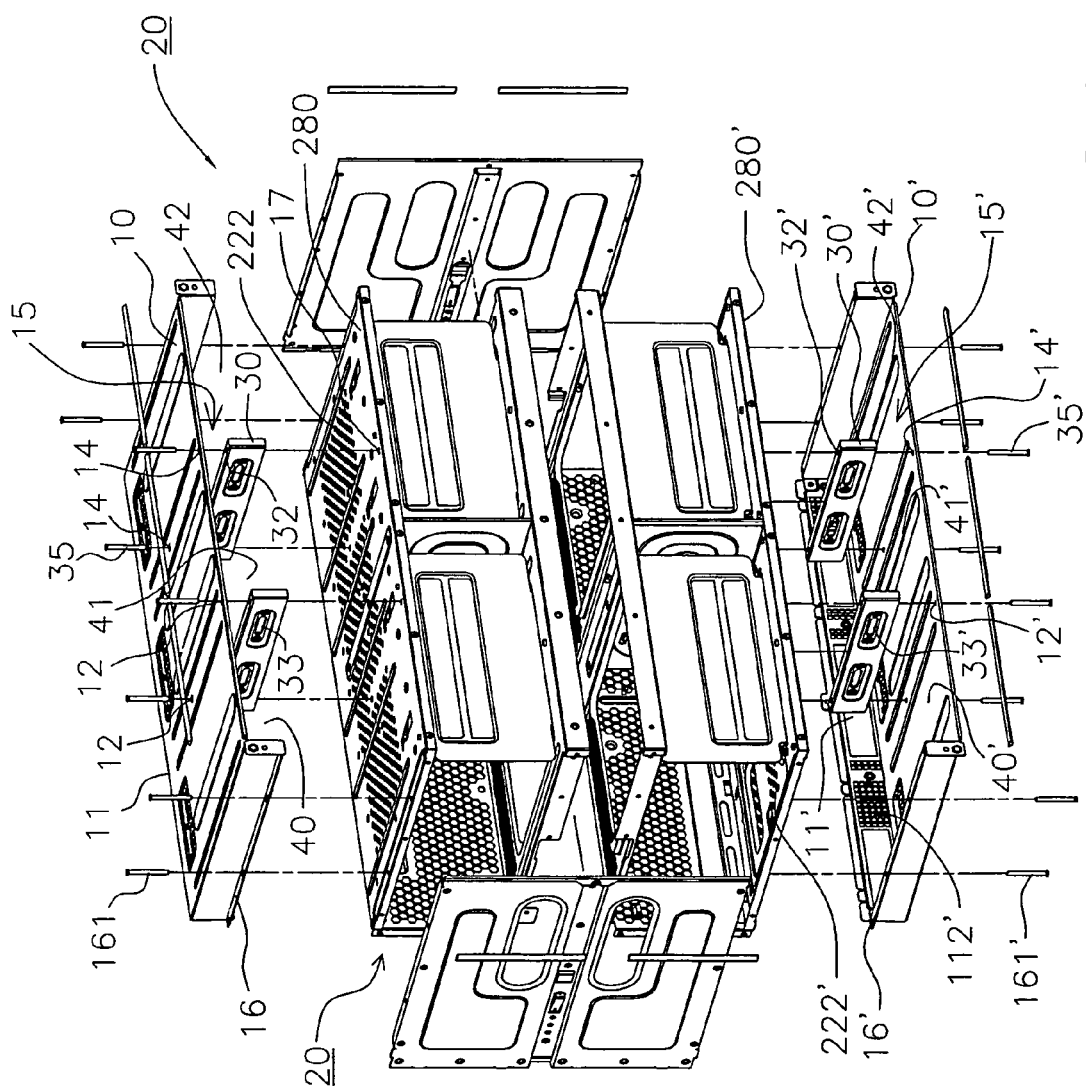
FIG. 1 shows an exploded elevational view according to the present invention.
Figure 2:
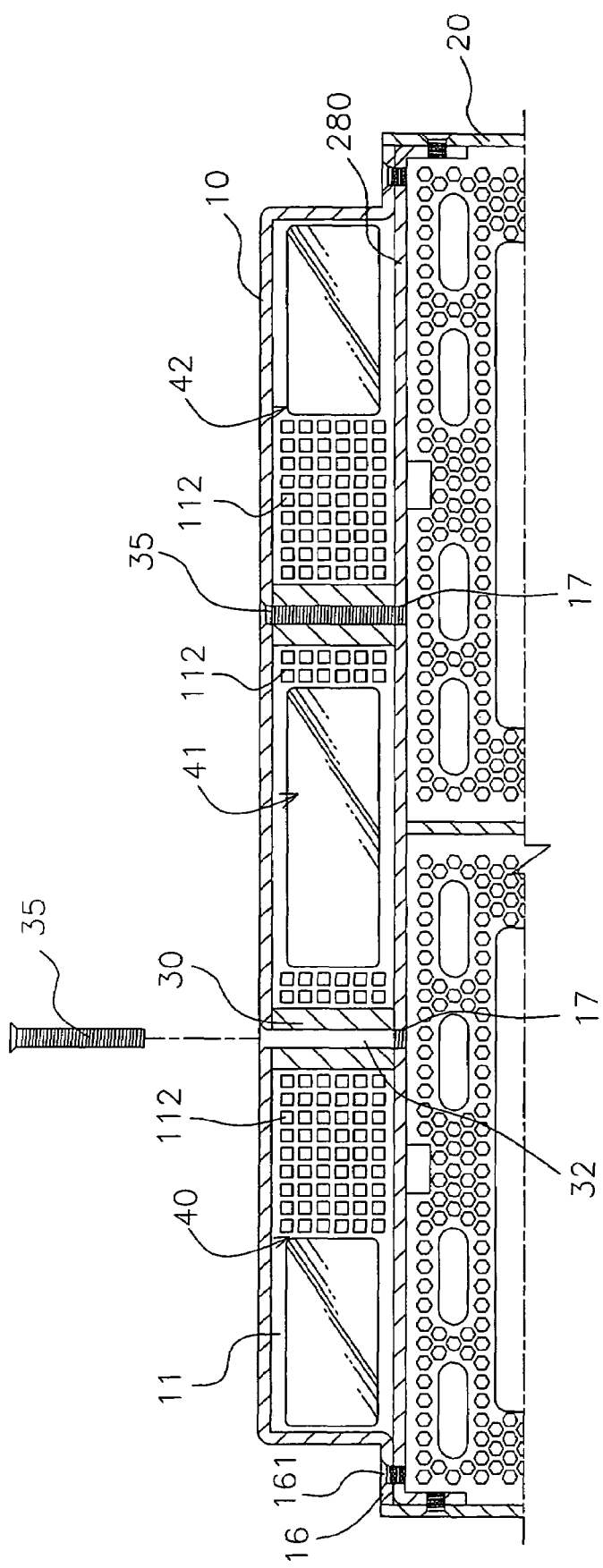
FIG. 2 shows a partial cross-sectional view depicting an upper cover assembled on an outer case of a host computer according to the present invention.

Referring to FIGS. 1 and 2, which show a partitioning device for holding slots of a host computer case of the present invention comprising:

a host computer outer case 20 provided with a horizontal upper panel 280;

an upper cover 10, a cross section of which assumes an inverted U-shape, and is provided with a rear wall 11; the upper cover 10 is fixedly assembled on the upper panel 280, a plurality of through holes 12, 14 are defined in a surface of the upper cover 10, and a single holding slot 15 is formed between the upper cover 10 and the upper panel 280;

two or more rectangular partitions 30, vertical connecting holes 32 are defined in an upper side of each of the rectangular partitions 30, which provide for vertical penetration into the holding slot 15, bolts 35 bolt into the through holes 12, 14 and into the vertically connecting holes 32, thereby fixing the partitions 30 within the holding slot 15, thus partitioning the holding slot 15 and forming three or more holding spaces 40, 41, 42.

Figure 3:
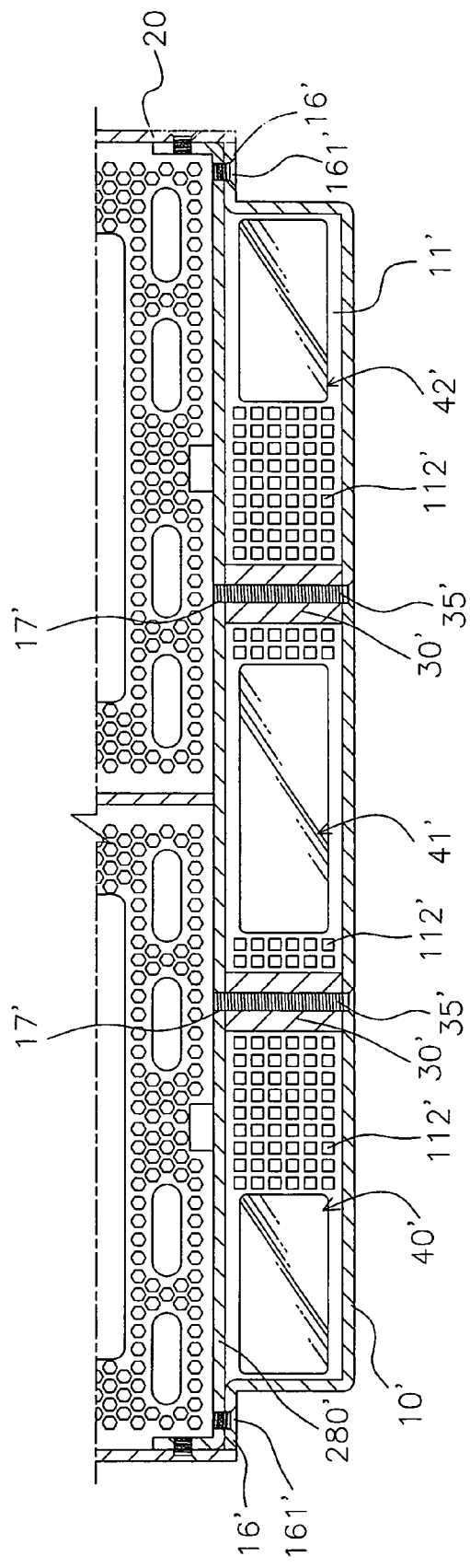
FIG. 3 shows a partial cross-sectional view depicting a lower cover assembled on an outer case of a host computer according to the present invention.

Referring to FIGS. 1 and 3, wherein the host computer outer case 20 is further provided with:

a horizontal lower panel 280';

a lower cover 10' having an inverted U-shaped cross section is provided with a rear wall 11', and the lower cover 10' is fixedly assembled on the lower panel 280', a plurality of through holes 12', 14' are defined in a surface of the lower cover 10', and a single holding slot 15' is formed between the lower cover 10' and the lower panel 280';

two or more rectangular partitions 30', connecting holes 32' are defined in a lower side of each of the partitions 30', which provide for vertical penetration into the holding slot 15', bolts 35' bolt into the through holes 12', 14' and into the connecting holes 32', thereby fixing the partitions 30' within the holding slot 15', thus partitioning the holding slot 15' and forming three or more holding spaces 40', 41', 42'.

Referring to FIG. 1, wherein vent holes 33, 33' are defined in surfaces of the rectangular partitions 30, 30' respectively, which enable reciprocal ventilation between the holding spaces 40, 41, 42 and between the holding spaces 40', 41', 42' respectively.

Meshed vent holes 222 and 222' are defined on the upper panel 280 and the lower panel 280' respectively, which enable reciprocal ventilation between air in the plurality of holding spaces 40, 41, 42, 40', 41', 42' and air within the host computer outer case 20.

Referring to FIGS. 1, 2 and 3, wherein the pre-defined through holes 12, 14 and 12', 14' of the upper cover 10 and the lower cover 10' respectively are vertically aligned.

Referring to FIGS. 1, 2 and 3, wherein two side ends of the upper cover 10 are respectively configured with a horizontal connecting panel 16. The connecting panels 16 are respectively bolted to two sides of the upper panel 280 using bolts 161. Two side ends of the lower cover 10' are respectively configured with a horizontal connecting panel 16'. The connecting panels 16' are respectively bolted to two sides of the upper panel 280' using bolts 161'.

Referring to FIGS. 1, 2 and 3, wherein meshes 112 and 112' are located on rear walls 11 and 11' of the upper cover 10 and the lower cover 10' respectively, which provide ventilation for the plurality of holding spaces 40, 41, 42 and 40', 41', 42' respectively.

Figure 4:
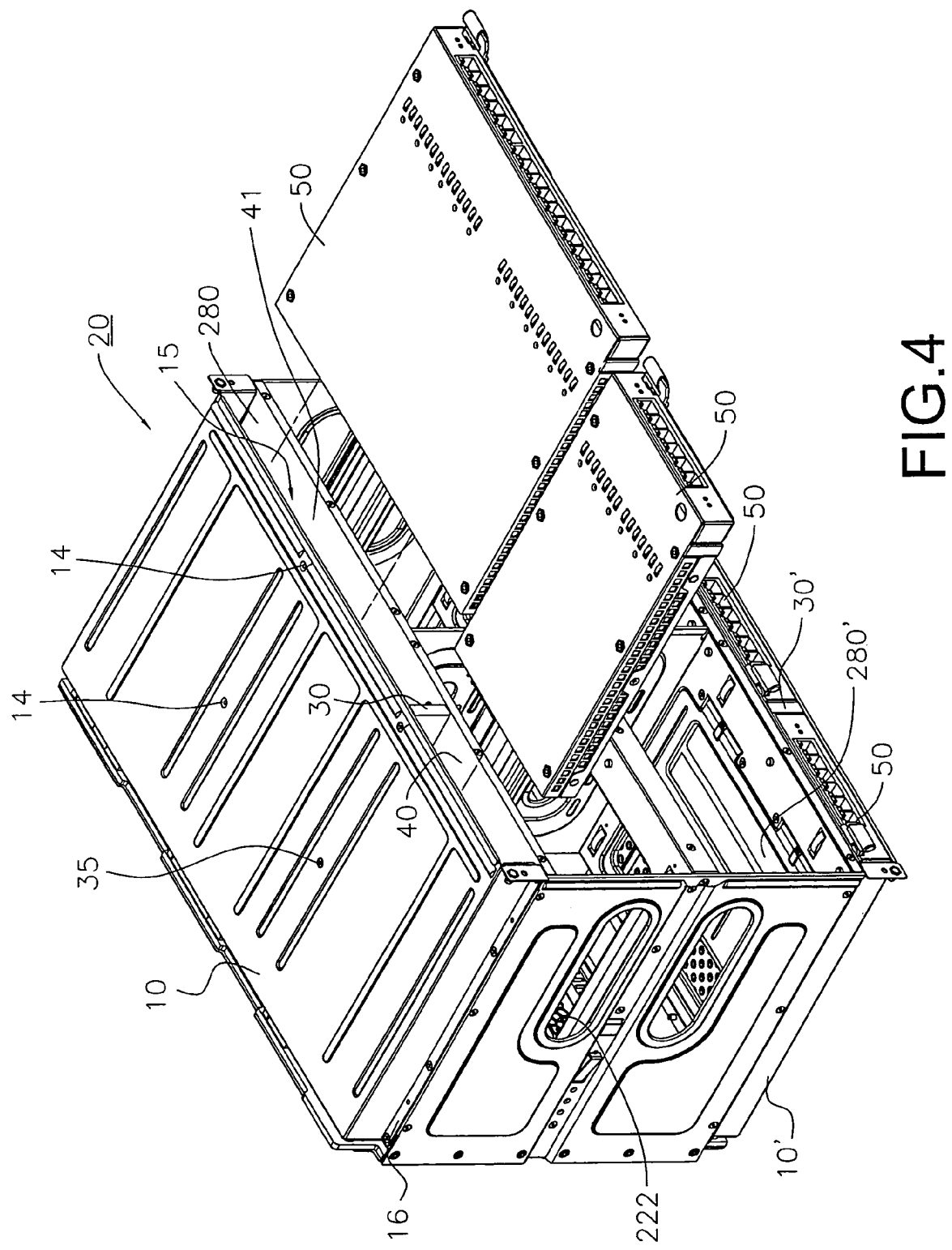
FIG. 4 shows an exploded elevational view depicting modular cases being inserted into holding spaces according to the present invention.

Referring to FIG. 4, wherein the plurality of holding spaces 40, 41, 42 and 40', 41', 42' enable modular cases 50 to be respectively inserted therein.

Referring to FIGS. 1, 2 and 3, wherein bolt holes 17 and 17' are defined in the upper panel 280 and the lower panel 280' respectively. which provide for the bolts 35 and 35' to respectively bolt therein.

Referring to FIG. 1, which shows an exploded view of two connecting panels 16, 16' bolted to upper and lower panels 280, 280' using bolts 161, 161' respectively, thereby enabling upper and lower covers 10, 10' to be stably joined to the upper and lower panels 280, 280' of an outer case 20 respectively, and thus form single holding slots 15 and 15'. The present invention is provided with more than at least one partition, wherein two partitions are provided in a preferred embodiment of the present invention. When one partition 30, 30' is respectively vertically bolted within each of the holding slots 15, 15' using bolts 35 and 35', two holding spaces 40, 41 and 40', 41' having different dimensions 15, 15' are thus formed in each of the portioned holding slots 15, 15' respectively (see FIGS. 1 and 4), which provide for the respective insertion of two different sized modular cases 50, (50) therein.

Figure 5:
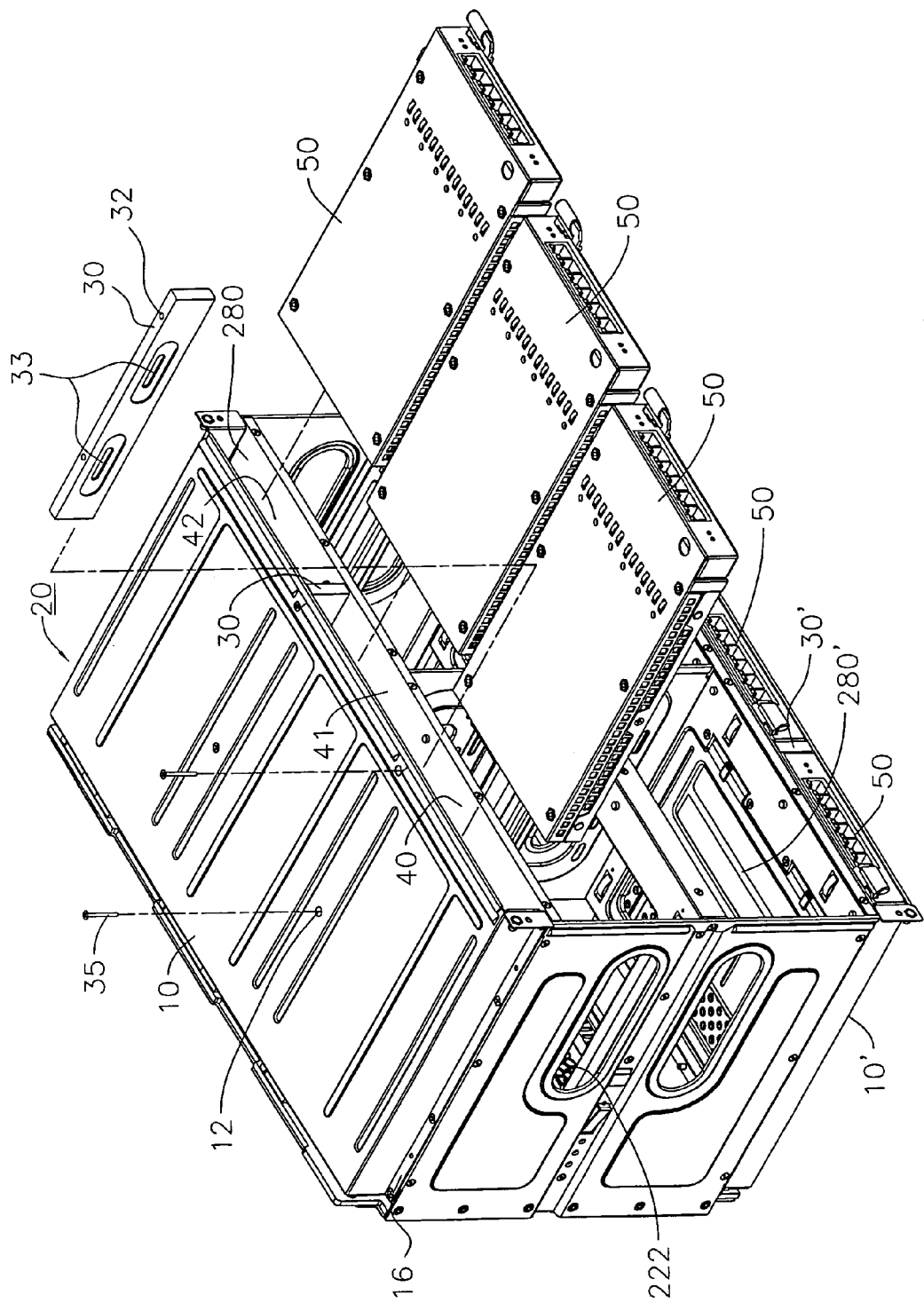
FIG. 5 shows another exploded elevational view depicting modular cases being inserted into holding spaces according to the present invention.

When two partitions 30, 30' are respectively vertically bolted within each of the holding slots 15, 15' using the bolts 35 and 35', three holding spaces 40, 41, 42 and 40', 41', 42' having identical dimensions are thus formed in each of the portioned holding slots 15, 15' respectively (see FIGS. 1 and 5), which provide for the respective insertion of three modular cases 50, (50) having identical sizes therein.

Rectangular vent holes 33 and 33' are defined in the respective partitions 30, 30', which enable ventilation flow between the adjacent holding spaces 40, 41, 42 and between the adjacent holding spaces 40', 41', 42'. Moreover, the configuration includes meshes 112 and 112' that improve air ventilation between the plurality of holding spaces 40, 41, 42 and 40', 41', 42' and vent holes 222 and 222' that improve reciprocal ventilation between air in the plurality of holding spaces 40, 41, 42, 40', 41', 42' and air within the host computer outer case 20, thereby achieving an improved heat dissipation effect and reducing case temperature of the modular cases 50, 50) when inserted into the plurality of holding spaces 40, 41, 42 and 40', 41', 42'.

In conclusion, respectively assembling the more than two partitions 30, 30' of the present invention into the holding slots 15, 15' enables forming the plurality of identical sized or different sized holding spaces 40, 41, 42 and 40', 41', 42', thereby achieving control of the number and size of the plurality of holding spaces 40, 41, 42 and 40', 41', 42' so as to accommodate insertion of the modular cases 50, (50) of various size specifications.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A partitioning device for holding slots of a host computer case, comprising:
   a host computer outer case defining a one piece continuous structure including a horizontal upper panel;
   an upper cover, a cross section of said upper cover defining an inverted U-shape, and includes a rear wall; the upper cover is fixedly assembled on the upper panel, a plurality of through holes defined in a surface of the upper cover, and a single holding slot formed between the upper cover and the upper panel;
   more than one rectangular partition, and vertical connecting holes defined in an upper side of each of the rectangular partitions, for vertical penetration into the holding slot, bolts bolted into the through holes and into the vertically connecting holes, thereby fixing the partitions within the holding slot, and partitioning the holding slot and forming at least more than two holding spaces;
   the outer case of the host computer further provided with a horizontal lower panel;
   a lower cover having an inverted U-shaped cross section including a a rear wall, and the lower cover fixedly assembled on the lower panel;
   a plurality of through holes are defined in a surface of the lower cover, and a single holding slot formed between the lower cover and the lower panel;
   more than one rectangular partition, connecting holes are defined in a lower side of each of the partitions for vertical penetration into the holding slots, bolts bolted into the through holes and into the connecting holes, thereby fixing the partitions within the holding slot and partitioning the holding slot and forming at least more than two holding spaces;
   vent holes defined in surfaces of the rectangular partitions, which enable reciprocal ventilation between the holding spaces;
   two side ends of the upper cover are respectively configured with a horizontal connecting panel that are respectively bolted to two sides of the upper panel using bolts;
   two side ends of the lower cover are respectively configured with horizontal connecting panels that are respectively bolted to two sides of the upper panel using bolts;
   wherein meshed vent holes are defined on the upper panel and the lower panel, which enable reciprocal ventilation between the plurality of holding spaces within the host computer outer case;
   wherein the pre-defined through holes of the upper cover and the lower cover are vertically aligned;
   wherein meshes are located on rear walls of the upper cover and the lower cover respectively to thereby provide ventilation for the plurality of holding spaces;
   the plurality of holding spaces enable modular cases to be inserted therein; and
   wherein bolt holes are defined in the upper panel and the lower panel and provide for the bolts to bolt therein.

* * * * *